United States Patent
Scotson (10) Patent No.: US 9,989,384 B2
(45) Date of Patent: Jun. 5, 2018

(54) MEASUREMENT OF MOTOR ROTOR POSITION OR SPEED

(75) Inventor: Peter Geoffrey Scotson, Worcester (GB)

(73) Assignee: TRW LIMITED, Solihull, West Midlands (GB)

( * ) Notice: Subject to any disclaimer, the term of this patent is extended or adjusted under 35 U.S.C. 154(b) by 582 days.

(21) Appl. No.: 14/126,122

(22) PCT Filed: Jun. 12, 2012

(86) PCT No.: PCT/GB2012/051323
§ 371 (c)(1),
(2), (4) Date: Mar. 20, 2014

(87) PCT Pub. No.: WO2012/172321
PCT Pub. Date: Dec. 20, 2012

(65) Prior Publication Data
US 2015/0091548 A1    Apr. 2, 2015

(30) Foreign Application Priority Data
Jun. 15, 2011 (GB) .................................. 1110039.3

(51) Int. Cl.
*G01R 25/00* (2006.01)
*G01D 5/243* (2006.01)
(Continued)

(52) U.S. Cl.
CPC .............. *G01D 5/243* (2013.01); *G01P 3/489* (2013.01); *G01R 25/00* (2013.01); *H02P 23/22* (2016.02)

(58) Field of Classification Search
None
See application file for complete search history.

(56) References Cited

U.S. PATENT DOCUMENTS

| 3,883,785 A | 5/1975 | Fulcher et al. |
| 4,772,839 A | 9/1988 | MacMinn et al. |

(Continued)

FOREIGN PATENT DOCUMENTS

| CN | 1740751 A | 3/2006 |
| EP | 1630526 A2 | 3/2006 |

(Continued)

OTHER PUBLICATIONS

State Intellectual Property Office of the People's Republic of China, Notification of the First Office Action and Search Report; Date of Notification: Aug. 5, 2014.

(Continued)

*Primary Examiner* — Daniel Miller
(74) *Attorney, Agent, or Firm* — MacMillan, Sobanski & Todd, LLC (57) ABSTRACT

A measurement circuit includes first and second inputs for receiving first and second input signals which vary cyclically with the rotational position of a rotor of an electric motor; a phase detector circuit; and an observer circuit that estimates the frequency and phase of the first and second input signals. The phase detector circuit determines a phase difference between first and second estimated signals with a phase difference dependent on the phase difference indicated by the estimates, the first and second estimated signals varying in quadrature with each other and the first and second input signals by adding a multiplicative combination of the first input signal with the first estimated signal to a multiplicative combination of the second input signal with the second estimated signal to result in a sum signal dependent upon the phase difference, The observer circuit varies the estimates dependent upon the sum signal.

15 Claims, 4 Drawing Sheets

(51) Int. Cl.
*G01P 3/489* (2006.01)
*H02P 23/22* (2016.01)

(56) References Cited

U.S. PATENT DOCUMENTS

| | | | |
|---|---|---|---|
| 5,134,404 A | 7/1992 | Peterson | |
| 5,325,026 A | 6/1994 | Lyons et al. | |
| 5,637,974 A | 6/1997 | McCann | |
| 5,864,217 A | 1/1999 | Lyons et al. | |
| 6,556,153 B1 | 4/2003 | Cardamone | |
| 6,674,261 B2 | 1/2004 | Takahashi et al. | |
| 6,707,265 B2 | 3/2004 | Imai et al. | |
| 6,897,435 B2 | 5/2005 | Remillard et al. | |
| 7,116,099 B2* | 10/2006 | Saito | G01D 3/022 324/174 |
| 7,123,175 B2 | 10/2006 | Katakura et al. | |
| 7,852,969 B2 | 12/2010 | Jansson | |
| 8,384,570 B2 | 2/2013 | Hunter | |
| 2002/0149335 A1 | 10/2002 | Imai et al. | |
| 2003/0030406 A1 | 2/2003 | Takahashi et al. | |
| 2006/0176005 A1 | 8/2006 | Ta et al. | |
| 2009/0034641 A1 | 2/2009 | Jensson | |
| 2010/0303460 A1 | 12/2010 | Hunter | |
| 2012/0143563 A1* | 6/2012 | Ueda | G01D 5/24476 702/151 |

FOREIGN PATENT DOCUMENTS

EP 1724926 A1 11/2006
WO 2004023639 A1 3/2004

OTHER PUBLICATIONS

International Search Report for PCT/GB2012/051323 dated Oct. 10, 2012.
Patent Acts 1977: Search Report under Section 17; Application No. GB1110039.3 dated Dec. 2, 2011.

* cited by examiner

MEASUREMENT OF MOTOR ROTOR POSITION OR SPEED

CROSS-REFERENCE TO RELATED APPLICATIONS

This application is a national stage of International Application No. PCT/GB2012/051323 filed Jun. 12, 2012, which claimed priority to Great Britain Patent Application No. GB 1110039.3 filed Jun. 15, 2011, the disclosures of which are incorporated herein by reference in entirety.

BACKGROUND OF THE INVENTION

This invention relates to a measurement circuit for, and a method of, measuring at least one of the rotational position and rotational speed of the rotor of an electric motor, and to related motor control circuits and electric power assisted steering systems.

The field of control of electric motors, such as may be used in such fields as driving electric power assisted steering (EPAS) systems, has been well explored in the prior art.

In motor control, in order to correctly control the operation of the motor, it is often required to be able to measure the position of the motor rotor, for example in order to switch the current supply to different phases of a multiple-phase motor. One motor commonly used in EPAS systems is the permanent magnet synchronous motor. This comprises a plurality of permanent magnets mounted on the motor rotor, with a plurality of phase windings surrounding the rotor to form the stator. By cyclically energising the phase windings, the rotor can be forced to rotate.

Such motors often have relatively low resolution position sensors, such as Hall-effect sensors mounted relative to the stator, which can indicate the passing of a permanent magnet pole on the rotor, and so indicate to a motor control circuit the appropriate moment to switch (or "commutate") the energisation of the phase windings.

However, it has been desired to remove the need to provide such sensors, and potentially to measure the rotational speed of the rotor also. One method of doing so is to determine the inductance of the motor by measuring the rate of change of motor current, as proposed in the PCT patent application published as WO2004/023639. It is desirable to improve the performance of such position sensing techniques.

BRIEF SUMMARY OF THE INVENTION

According to a first aspect of the invention, there is provided a measurement circuit for measuring at least one of the rotational position and rotational speed of the rotor of an electric motor, the circuit comprising:
  first and second inputs for receiving first and second input signals which vary cyclically with the rotational position of the rotor, the first and second input signals at the first and second inputs varying in quadrature with each other;
  a phase detector circuit; and
  an observer circuit;
  in which the observer circuit is arranged to generate estimates indicative of the frequency and phase of the first and second input signals;
  in which the phase detector circuit is arranged to determine the phase difference between first and second estimated signals varying cyclically and at the frequency indicated by the estimates with a phase difference dependent on the phase difference indicated by the estimates, the first and second estimated signals varying in quadrature with each other on the one hand and the first and second input signals on the other by adding a multiplicative combination of the first input signal with the first estimated signal to a multiplicative combination of the second input signal with the second estimated signal to result in a sum signal dependent upon the phase difference; and
  in which the observer circuit is arranged to vary the estimates dependent upon the sum signal.

By doing so, we have determined that there is no longer the need to employ a low pass filter as in a prior-art phase lock loop system, as the sum signal will not have a term dependent upon the sum of the frequency of the first and second estimated signals and the frequency of the first and second input signals.

The circuit may further comprise a velocity estimation circuit, which is arranged to take the first and second input signals and to output a velocity signal indicative of the rotational speed of the motor rotor by determining the rate of change of one of the first and second input signals and dividing the rate of change by the other of the first and second input signals. The velocity determining circuit may be arranged such that the first or second input signal used to divide the rate of change is the larger of the first and second input signal, so as to avoid errors due to dividing by a number close to zero, or an error due to dividing by zero itself.

The observer circuit may be arranged so as to generate the estimates based upon the phase difference and the output of the velocity determining circuit. The observer circuit may be arranged to determine the first and second estimated signals based upon its estimates. As such, by making the estimates depend upon the velocity estimate, the precision with which the circuit will follow the actual velocity and/or position of the rotor as the velocity changes has been found to improve over prior art phase lock loops, which merely measure the phase difference.

The circuit may further comprise a normalisation circuit, arranged so as to normalise the first and second input signals. The amplitude of the signals is not particularly important (only the phase and frequency), and so by normalising the signals, any deleterious effects of amplitude variation can be avoided. As such, the normalisation circuit may be arranged to divide each of the first and second signals by the square root of the sum of the squares of the first and second input signals; given that the first and second signals are cyclically varying in quadrature, this divisor is likely to represent the amplitude of each of the signals, and so result in a normalised amplitude of unity.

The first and second signals may be indicative of the inductance of the motor, and as such may depend upon or be the derivative of the current flowing at least one phase winding of the motor.

According to a second aspect of the invention, there is provided a motor control circuit for controlling an electric motor having a rotor, the motor control circuit comprising:
  a measurement circuit according to the first aspect of the invention;
  a sensor arranged to output first and second input signals, which vary cyclically with the rotational position of the rotor, to the first and second inputs of the measurement circuit; and
  at least one output indicative of an electric current to be applied to the electric motor;

in which the motor control circuit is arranged so as to vary the output dependent upon the estimates output by the measurement circuit.

According to a third aspect of the invention, there is provided a combination of an electric motor having a rotor and the motor control circuit of the second aspect of the invention arranged so as to control the motor, with the sensor of the motor control circuit being arranged so as to sense the rotational position of the rotor.

According to a fourth aspect of the invention, there is provided an electric power assisted steering system, comprising a steering wheel, a steering mechanism which operatively couples the steering wheel to road wheels of a vehicle, a electric motor being arranged so as to apply in use a force to part of the steering mechanism, a torque sensor which, in use, provides a torque signal indicative of the torque carried by part of the steering mechanism and a motor control circuit arranged to control the motor by generating, in use, a current signal indicative of the current to be applied to the electric motor in accordance with the second aspect of the invention.

According to a fifth aspect of the invention, there is provided a method of measuring at least one of the rotational position and rotational speed of the rotor of an electric motor, the method comprising:
  receiving first and second input signals which vary cyclically with the rotational position of the rotor, the first and second input signals varying in quadrature with each other;
  generating first and second estimated signals, the first and second estimated signals varying cyclically and having the same frequency but varying in quadrature with each other;
  determining the phase difference between the first and second estimated signals on the one hand and the first and second input signals on the other by adding a multiplicative combination of the first input signal with the first estimated signal to a multiplicative combination of the second input signal with the second estimated signal to result in a sum signal dependent upon the phase difference; and
  varying the frequency of the first and second estimated signals dependent upon the sum signal.

By doing so, we have determined that there is no longer the need to employ a low pass filter as in a prior-art phase lock loop system, as the sum signal will not have a term dependent upon the sum of the frequency of the first and second estimated signals and the frequency of the first and second input signals.

The method may further comprise the step of estimating the velocity of the motor rotor by determining the rate of change of one of the first and second input signals and dividing the rate of change by the other of the first and second input signals. The method may comprise determining which of the first or second input signal is the larger and using the larger of the first and second input signals to divide the rate of change, so as to avoid errors due to dividing by a number close to zero, or an error due to dividing by zero itself.

The method may comprise estimating at least one of the rotational position and the rotational speed of the motor rotor based upon the phase difference and the output of the velocity determining circuit. As such, by making the estimates depend upon the velocity estimate, the precision with which the circuit will follow the actual velocity and/or position of the rotor as the velocity changes has been found to improve over prior art phase lock loops, which merely measure the phase difference.

The method may further comprise normalisation of the first and second input signals. The amplitude of the signals is not particularly important (only the phase and frequency), and so by normalising the signals, any deleterious effects of amplitude variation can be avoided. As such, the method may comprise dividing each of the first and second signals by the square root of the sum of the squares of the first and second input signals; given that the first and second signals are cyclically varying in quadrature, this divisor is likely to represent the amplitude of each of the signals, and so result in a normalised amplitude of unity.

The first and second signals may be indicative of the inductance of the motor, and as such may depend upon or be the derivative of the current flowing at least one phase winding of the motor. The method may comprise generating the first and second signals, typically by differentiating the current flowing through at least one phase of the motor.

In the above aspects, the motor may be a permanent magnet motor, typically a permanent magnet synchronous motor.

Other advantages of this invention will become apparent to those skilled in the art from the following detailed description of the preferred embodiments, when read in light of the accompanying drawings.

BRIEF DESCRIPTION OF THE DRAWINGS

FIG. 4b shows a graph of the difference between the estimated and actual rotor position of FIG. 4a; and FIG. 4c shows the current applied to the motor in the test procedure of FIG. 4a.

DETAILED DESCRIPTION OF THE INVENTION

Figure 1:
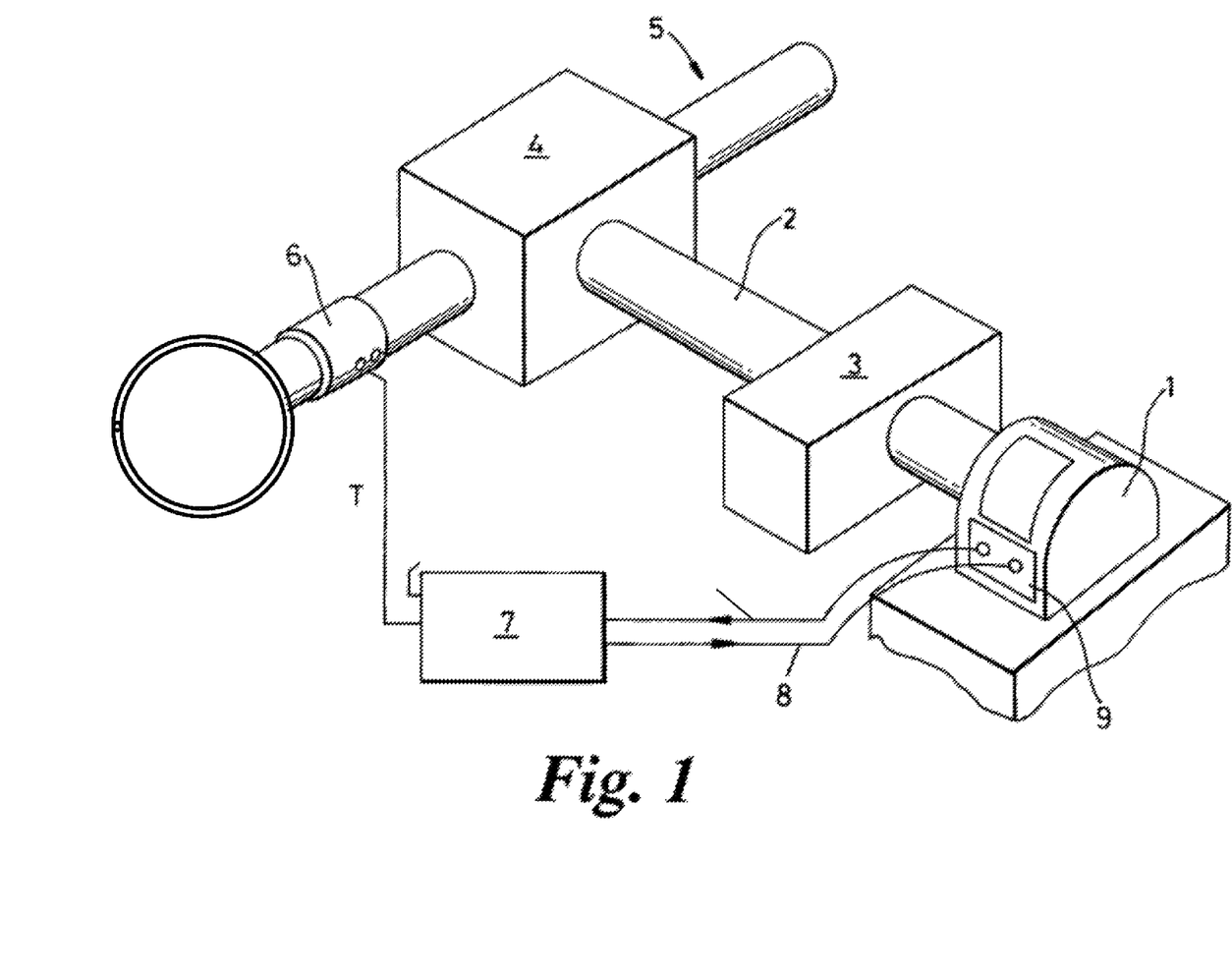
FIG. 1 shows an electric power assisted steering (EPAS) system having a measurement circuit according to an embodiment of the invention.

An electric power assisted steering assembly is illustrated in FIG. 1 of the accompanying drawings. The apparatus comprises an electric motor 1 which acts upon a drive shaft 2 through a gearbox 3 of the rack and pinion type. The drive shaft 2 terminates with a worm gear 4 that co-operates with a wheel (not shown) provided on a portion of a steering column 5 or a shaft operatively connected to the steering column.

The steering column 5 carries a torque sensor 6 that is adapted to measure the torque carried by the steering column 5. This torque is produced by the driver turning the steering wheel, either to turn a corner or to counter pull of the vehicle to one side. An output signal T from this sensor 6 is fed to a signal processing means in the form of a signal processor 7, which takes the torque input signals T and outputs commands to a drive circuit 9 for the motor 1 over line 8a. The drive circuit 9 in turn, returns a signal indicative of the current flowing in the windings of the motor 1 over line 8b.

Figure 2:
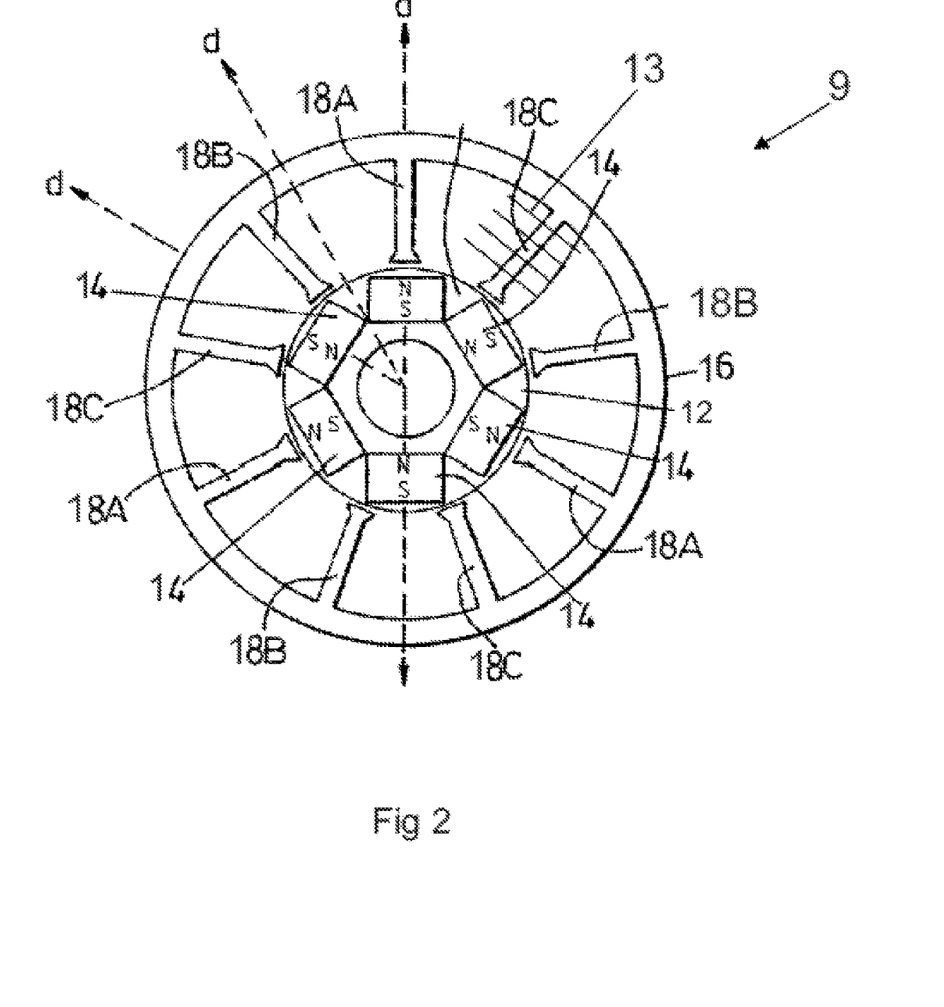
FIG. 2 shows a cross section through the motor of the EPAS system of FIG. 1.

The motor 1 is shown in more detail in FIG. 2 of the accompanying drawings. The motor 1 is a three phase brushless motor, which comprises a rotor 12 having six embedded magnets 14 which, in this instance, are arranged so as to provide six poles which alternate between north and south around the rotor 12.

A stator 16 comprises a nine slot copper wound element having three groups of three teeth 18A, 18B, 18C each group of teeth having a common winding (example shown as 13) forming a respective phase. There are therefore three electrical cycles in each full rotation of the rotor 12, as the rotor 12 and its magnets 14 have threefold circular symmetry, meaning that each 120 degree rotation of the rotor 12 leaves it in an equivalent position.

Figure 3:
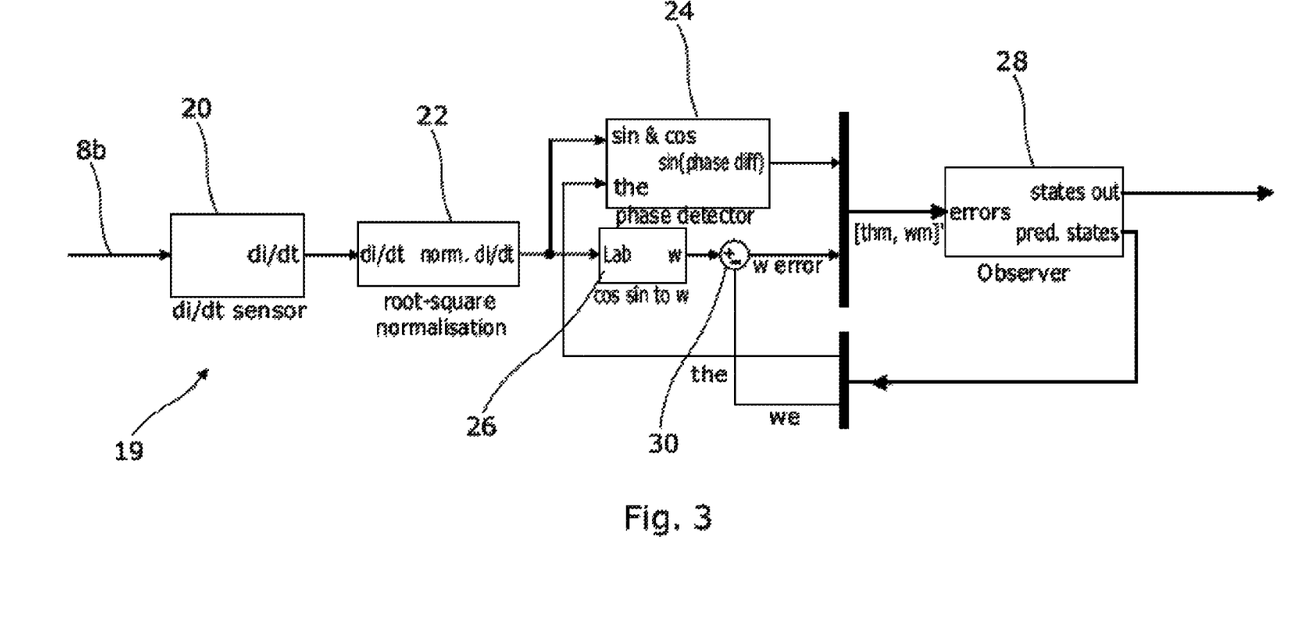
FIG. 3 shows schematically the function of the measurement circuit of the EPAS system of FIG. 1.

In order to determine the rotational position of the rotor 12 within an electrical revolution (that is, to one of three rotational positions of the rotor 12, spaced apart by 120 degrees), the signal processor 7 is provided a measurement circuit 19 with the functionality shown in FIG. 3 of the accompanying drawings.

The measurement circuit 19 is provided with a di/dt sensor 20, which takes the currents flowing through the motor (typically through a ground return in common to each of the phases) and differentiates them, in order to arrive at two cyclically varying indications of the rate of change of current. These signals are indicative of the inductance of the phase windings 13 at that particular instant.

The two signals, which will be indicated as $A\sin(\omega_1 t+\phi_1)$ and $A\cos(\omega_1 t+\phi_1)$, vary in quadrature with each other—that is, they are a quarter cycle out of phase. A suitable di/dt sensor can be found in the PCT publication WO2004/023639, the contents of which are hereby incorporated by reference. In that document, Park's transformation is used to generate these two signals, therein referred to as $L_\alpha$ and $L_\beta$ (from equation 7, page 15). In these two signals, t is time, A is the amplitude of the two signals (which will be the same), $\omega_1$ is the angular speed of the rotor (in radians per second) and $\phi_1$ is a phase offset (again in radians) from an arbitrary datum.

The di/dt sensor 20 outputs the two signals $A\sin(\omega_1 t+\phi_1)$ and $A\cos(\omega_1 t+\phi_1)$ to a normalisation circuit 22. In order to prevent the transient response of the circuit depending on the amplitude of the currents, the two signals are normalised to an amplitude of unity. This is done by dividing each of the signals by the square root of the sum of the squares of the two signals; this divisor will always be A as follows:

$$\sqrt{A^2\sin^2(\omega_1 t+\phi_1)+A^2\cos^2(\omega_1 t+\phi_1)}=$$
$$\sqrt{A^2(\sin^2(\omega_1 t+\phi_1)+\cos^2(\omega_1 t+\phi_1))}=\sqrt{A^2}=A$$

which makes use of the trigonometric identity that $\sin^2 x+\cos^2 x=1$, $\sin^2 x$ and similar terms meaning $(\sin x)^2$ and so on.

Thus, the output of the normalisation circuit 22 will be the original two signals, normalised to unity, and thus can be represented by $\sin(\omega_1 t+\phi_1)$ and $\cos(\omega_1 t+\phi_1)$.

The output of the normalisation circuit 22 is passed to a phase detector circuit 24. This determines the phase difference between estimates of the phase difference and frequency calculated by an observer circuit 28 discussed below and the normalised signals from the normalisation circuit 22. The estimates are provided to the phase detector circuit as a motor position estimate $\theta=\omega_2 t+\phi_2$, from which the phase detector circuit determines first and second estimated signals as $\sin(\omega_2 t+\phi_2)$ and $\cos(\omega_2 t+\phi_2)$.

The phase detector circuit then calculates the difference between the two products generated by multiplying the sine term of one signal with the cosine term of the other signal, thusly:

$$y(t)=\sin(\omega_1 t+\phi_1)\cos(\omega_2 t+\phi_2)-\cos(\omega_1 t+\phi_1)\sin(\omega_2 t+\phi_2)$$

Applying the trigonometric identity $$\sin\theta\cos\varphi = \frac{\sin(\theta+\varphi)+\sin(\theta-\varphi)}{2}$$

to both terms of the subtraction:

$$y(t) = \frac{1}{2}\begin{pmatrix}\sin(\omega_1 t+\phi_1+\omega_2 t+\phi_2)+\sin(\omega_1 t+\phi_1-\omega_2 t-\phi_2)-\\ \sin(\omega_2 t+\phi_2+\omega_1 t+\phi_1)-\sin(\omega_2 t+\phi_2-\omega_1 t-\phi_1)\end{pmatrix}$$

$$y(t) = \sin(\omega_1 t+\phi_1-\omega_2 t-\phi_2) = \sin((\omega_1-\omega_2)t+\phi_1-\phi_2)$$

Thus, the two terms that vary at the sum of the frequencies $\omega_1+\omega_2$ cancel each other out, leaving only a term that varies at the difference of the frequencies $\omega_1-\omega_2$ and that depends upon the phase difference $\phi_1-\phi_2$ between the estimated and measured signals. As such, when the estimated signals correctly estimate $\omega_2$ and $\phi_2$, the signal y(t) will be zero; if the frequency or the phase deviate slightly, the signal y(t) can be used to indicate the error as explained below.

Unlike prior art phase lock loop (PLL) techniques, there is no higher frequency term that requires filtering. Given that it is desirable to be able to use the present circuit with a motor with wildly varying speed and so frequency, prior art PLL techniques would have required that a variable frequency filter be used to eliminate the higher frequency terms, which is no longer needed with the present invention.

The output of the normalisation circuit is also passed to a velocity detector 26. This determines the speed $\omega_1$ of the motor by differentiating one of the normalised signals and dividing the differentiated signal by the other. Taking, for example, the sine component as the component to be differentiated:

$$\frac{\left(\frac{d(\sin(\omega_1 t+\phi))}{dt}\right)}{\cos(\omega_1 t+\phi)} = \frac{\omega_1\cos(\omega_1 t+\phi)}{\cos(\omega_1 t+\phi)} = \omega_1$$

However, to avoid a possible loss of precision or outright error when calculating the division, the velocity detection circuit will differentiate the smaller in magnitude of the two signals, and use the larger magnitude signal as the divisor.

The observer circuit 28 is provided which takes the output of the phase detector and the difference (as calculated by a difference circuit 30) between the measured speed $\omega_1$ and the speed $\omega_2$ predicted by the observer circuit 28. The observer circuit then takes the inputs and uses them to determine new estimates of the speed $\omega_2$ and rotational position $\theta=\omega_2 t+\phi_2$ of the rotor 12 (within an electrical revolution); these are then used to generate the two estimated signals $\sin(\omega_2 t+\phi_2)$ and $\cos(\omega_2 t+\phi_2)$.

It is to be noted that the phase difference circuit outputs a value that is dependent upon the sine of the phase difference (measured in radians). The system uses the small angle approximation to avoid needing to carry out an inverse sine operation; when the phase difference is small, the sine of the phase difference will be approximately equal to the phase difference; as the difference increases, the error in the phase difference will increase, but will still have the same sign and will therefore cause the estimate to be corrected in the correct direction. As such, the output of the phase difference circuit is used directly as the phase difference below.

The estimates $\omega_2$ and $\theta$ are updated in two ways: firstly, in accordance with the physical dynamics of a rotating motor; and secondly according to the phase difference and speed measurement estimate already determined. According to the physical dynamics, the position $\theta$ is increased or decreased in proportion to the current speed estimate $\omega_2$. Next, $\theta$ is updated according to phase difference $\delta\phi=\phi_1-\phi_2$ and speed measurement estimate and in proportion to the phase difference and speed measurement difference calculated as follows:

$$\theta(t+1)=\theta(t)+a_{12}\omega_2(t)+b_{11}\delta\phi+b_{12}(\omega_1-\omega_2(t))$$

where
$\theta(t+1)$ is the new observer estimate of the position
$\theta(t)$ is the current observer estimate of the position
$\delta\phi$ is the phase difference
$\omega_1-\omega_2(t)$ is the speed measurement difference calculated
$\omega_1$ is the measured speed estimate
$\omega_2(t)$ is the current observer estimate of the speed
$a_{12}$ is the proportion of the current speed estimate, usually set equal to the time between samples
$b_{11}$ is the proportion of the phase difference used to update the position estimate, usually set less than one.
$b_{12}$ is the proportion of the measured speed estimate used to update the position estimate, usually set less than the time between samples The speed estimate can be computed in a similar way:

$$\omega_2(t+1)=\omega_2(t)+b_{22}(\omega_1-\omega_2(t))$$

Where
$\omega_2(t+1)$ is the new observer estimate of the speed
$b_{22}$ is the proportion of the measured speed estimate used to update the observer speed estimate The values of the a and b coefficients can be adjusted to control and adapt the performance of the observer as desired.

The estimated values of the motor rotor rotational position $\theta$ and the rotor speed $\omega_2$ are then output, and can be used in the signal processor 7 in order to control the switching of the phases 13 in any suitable manner.

Figure 4A:
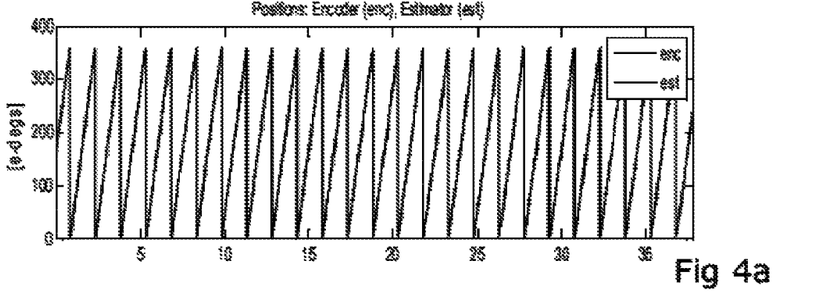
FIG. 4a shows a graph of estimated and actual rotor position in a test procedure carried out according to the embodiment of FIG. 1.
Figure 4B:
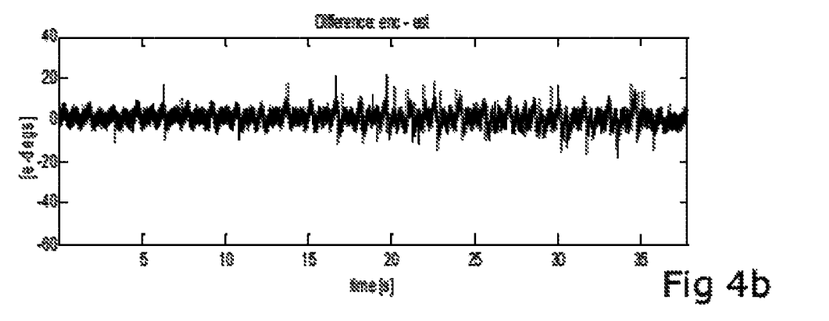
Figure 4C:
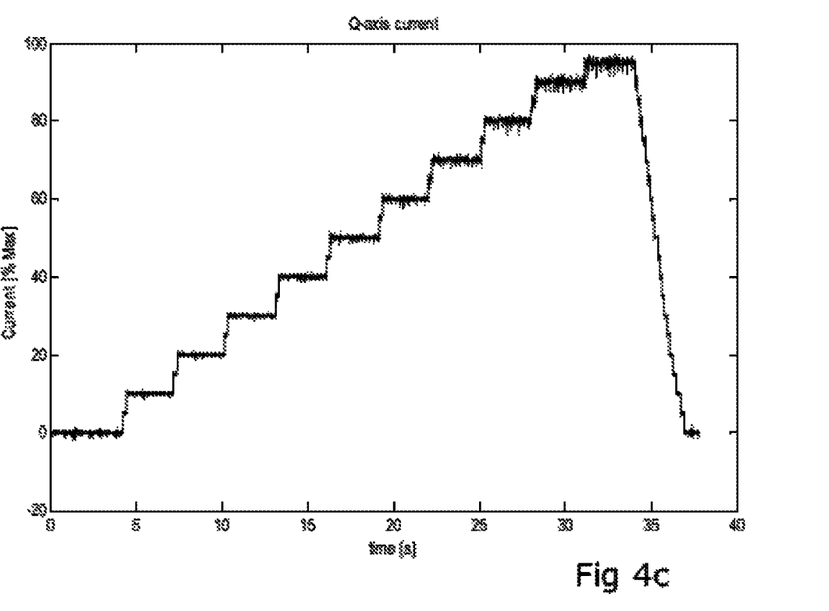

Some graphs showing the results of a prototype system can be seen in FIGS. 4a to 4c of the accompanying drawings. FIG. 4c shows the current applied to the phases of a test motor over an approximately 37 second long test run. FIG. 4a shows both the actual motor position (measured by a suitable position encoder, the trace shown as "enc") and the estimated value $\theta$ determined by the observer circuit ("est"). From FIG. 4a, the two traces appear practically indistinguishable.

FIG. 4b shows the difference between the actual and estimated measurements, and as such represents the difference between the "enc" and "est" traces of FIG. 4a. This shows that there is some error in the measurement, but it is generally at a low level, but increasing as the current applied to the motor increases.

Whilst the embodiment above has been described with the functions shown in FIG. 3 described as circuits and the like, the method could be implemented in a suitable microprocessor such as field programmable gate array or even any general purpose microprocessor suitably programmed.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

The invention claimed is:

1. A measurement circuit for measuring at least one of the rotational position and rotational speed of the rotor of an electric motor, the circuit comprising:
   first and second inputs for receiving first and second actual rotor position input signals which vary cyclically with the rotational position of the rotor, the first and second actual rotor position input signals at the first and second inputs varying in quadrature with each other;
   a phase detector circuit; and
   an observer circuit;
   in which the observer circuit is arranged to generate estimates indicative of the frequency and phase of the first and second actual rotor position input signals;
   in which the phase detector circuit is arranged to determine the phase difference between first and second estimated signals, varying cyclically and at the frequency indicated by the estimates with a phase dependent on the phase indicated by the estimates, the first and second estimated signals varying in quadrature with each other, on the one hand and the first and second actual rotor position input signals on the other by adding (1) a multiplicative combination of the first actual rotor position input signal with the first estimated signal to (2) a multiplicative combination of the second actual rotor position input signal with the second estimated signal to result in a sum signal dependent upon the phase difference; and in which the observer circuit is arranged to vary the estimates dependent upon the sum signal,
   further comprising a velocity estimation circuit, which is arranged to take the first and second actual rotor position input signals and to output a velocity signal indicative of the rotational speed of the motor rotor by determining the rate of change of one of the first and second actual rotor position input signals and dividing the rate of change by the other of the first and second actual rotor position input signals.

2. The measurement circuit of claim 1, in which the velocity estimation circuit is arranged such that the first or second actual rotor position input signal used to divide the rate of change is the larger of the first and second input signal.

3. The measurement circuit of claim 1, in which the observer circuit is arranged so as to generate the estimates based upon the phase difference and the output of the velocity estimation circuit.

4. The measurement circuit of claim 1, comprising a normalisation circuit, arranged so as to normalise the first and second actual rotor position input signals.

5. The measurement circuit of claim 4, in which the normalisation circuit is arranged to divide each of the first and second actual rotor position input signals by the square root of the sum of the squares of the first and second actual rotor position input signals.

6. A motor control circuit for controlling an electric motor having a rotor, the motor control circuit comprising:
   a measurement circuit, the measurement circuit comprising:
   first and second inputs for receiving first and second actual rotor position input signals which vary cyclically with the rotational position of the rotor, the first and second actual rotor position input signals at the first and second inputs varying in quadrature with each other;

a phase detector circuit; and an observer circuit;

in which the observer circuit is arranged to generate estimates indicative of the frequency and phase of the first and second actual rotor position input signals;

in which the phase detector circuit is arranged to determine the phase difference between first and second estimated signals, varying cyclically and at the frequency indicated by the estimates with a phase difference dependent on the phase difference indicated by the estimates, the first and second estimated signals varying in quadrature with each other, on the one hand and the first and second actual rotor position input signals on the other by adding (1) a multiplicative combination of the first actual rotor position input signal with the first estimated signal to (2) a multiplicative combination of the second actual rotor position input signal with the second estimated signal to result in a sum signal dependent upon the phase difference; and in which the observer circuit is arranged to vary the estimates dependent upon the sum signal, the measurement circuit further comprising a velocity estimation circuit, which is arranged to take the first and second actual rotor position input signals and to output a velocity signal indicative of the rotational speed of the motor rotor by determining the rate of change of one of the first and second actual rotor position input signals and dividing the rate of change by the other of the first and second actual rotor position input signals;

the motor control circuit further comprising:

a sensor arranged to output first and second actual rotor position input signals, which vary cyclically with the rotational position of the rotor, to the first and second inputs of the measurement circuit; and at least one output indicative of an electric current to be applied to the electric motor;

in which the motor control circuit is arranged so as to vary the output dependent upon the estimates output by the measurement circuit.

7. A combination of an electric motor having a rotor and a motor control circuit comprising:

a measurement circuit, the measurement circuit comprising:

first and second inputs for receiving first and second actual rotor position input signals which vary cyclically with the rotational position of the rotor, the first and second actual rotor position input signals at the first and second inputs varying in quadrature with each other;

a phase detector circuit; and an observer circuit;

in which the observer circuit is arranged to generate estimates indicative of the frequency and phase of the first and second actual rotor position input signals;

in which the phase detector circuit is arranged to determine the phase difference between first and second estimated signals, varying cyclically and at the frequency indicated by the estimates with a phase difference dependent on the phase difference indicated by the estimates, the first and second estimated signals varying in quadrature with each other, on the one hand and the first and second actual rotor position input signals on the other by adding (1) a multiplicative combination of the first actual rotor position input signal with the first estimated signal to (2) a multiplicative combination of the second actual rotor position input signal with the second estimated signal to result in a sum signal dependent upon the phase difference; and in which the observer circuit is arranged to vary the estimates dependent upon the sum signal, the measurement circuit further comprising a velocity estimation circuit, which is arranged to take the first and second actual rotor position input signals and to output a velocity signal indicative of the rotational speed of the motor rotor by determining the rate of change of one of the first and second actual rotor position input signals and dividing the rate of change by the other of the first and second actual rotor position input signals;

the motor control circuit further comprising;

a sensor arranged to output first and second actual rotor position input signals, which vary cyclically with the rotational position of the rotor, to the first and second inputs of the measurement circuit; and at least one output indicative of an electric current to be applied to the electric motor;

in which the motor control circuit is arranged so as to vary the output dependent upon the estimates output by the measurement circuit, in which the motor control circuit is arranged so as to control the motor dependent on the output of the motor control circuit, with the sensor of the motor control circuit being arranged so as to sense the rotational position of the rotor.

8. An electric power assisted steering system comprising:

a steering wheel, a steering mechanism which operatively couples the steering wheel to road wheels of a vehicle, a electric motor being arranged so as to apply in use a force to part of the steering mechanism, a torque sensor which, in use, provides a torque signal indicative of the torque carried by part of the steering mechanism and a motor control comprising:

a measurement circuit, the measurement circuit comprising: first and second inputs for receiving first and second actual rotor position input signals which vary cyclically with the rotational position of the rotor, the first and second actual rotor position input signals at the first and second inputs varying in quadrature with each other;

a phase detector circuit; and an observer circuit;

in which the observer circuit is arranged to generate estimates indicative of the frequency and phase of the first and second actual rotor position input signals;

in which the phase detector circuit is arranged to determine the phase difference between first and second estimated signals, varying cyclically and at the frequency indicated by the estimates with a phase difference dependent on the phase difference indicated by the estimates, the first and second estimated signals varying in quadrature with each other, on the one hand and the first and second actual rotor position input signals on the other by adding (1) a multiplicative combination of the first actual rotor position input signal with the first estimated signal to (2) a multiplicative combination of the second actual rotor position input signal with the second estimated signal to result in a sum signal dependent upon the phase difference; and in which the observer circuit is arranged to vary the estimates dependent upon the sum signal, the measurement circuit further comprising a velocity estimation circuit, which is arranged to take the first and second actual rotor position input signals and to output a velocity signal indicative of the rotational speed of the motor rotor by determining the rate of change of one of the first and second actual rotor position input signals and dividing the rate of change by the other of the first and second actual rotor position input signals;

the motor control circuit further comprising:

a sensor arranged to output first and second actual rotor position input signals, which vary cyclically with the rotational position of the rotor, to the first and second inputs of the measurement circuit; and at least one output indicative of an electric current to be applied to the electric motor;

in which the motor control circuit is arranged so as to vary the output dependent upon the estimates output by the measurement circuit.

9. A method of measuring at least one of the rotational position and rotational speed of the rotor of an electric motor, the method comprising:

receiving first and second actual rotor position input signals which vary cyclically with the rotational position of the rotor, the first and second actual rotor position input signals varying in quadrature with each other;

generating first and second estimated signals, the first and second estimated signals varying cyclically and having the same frequency but varying in quadrature with each other;

determining the phase difference between the first and second estimated signals on the one hand and the first and second actual rotor position input signals on the other by adding (1) a multiplicative combination of the first actual rotor position input signal with the first estimated signal to (2) a multiplicative combination of the second actual rotor position input signal with the second estimated signal to result in a sum signal dependent upon the phase difference;

varying the frequency of the first and second estimated signals dependent upon the sum signal; and estimating the velocity of the motor rotor by determining the rate of change of one of the first and second actual rotor position input signals and dividing the rate of change by the other of the first and second actual rotor position input signals.

10. The method of claim 9, comprising determining which of the first or second actual rotor position input signal is the larger and using the larger of the first and second actual rotor position input signals to divide the rate of change.

11. The method of claim 9, comprising estimating at least one of the rotational position and the rotational speed of the motor rotor based upon the phase difference and the output of the velocity estimation circuit.

12. The method of claim 9, comprising normalization of the first and second actual rotor position input signals.

13. The method of claim 12, in which the normalization comprises dividing each of the first and second actual rotor position input signals by the square root of the sum of the squares of the first and second actual rotor position input signals.

14. The method of claim 9, in which the first and second actual rotor position input signals are indicative of the inductance of the motor, and as such depend upon or are the derivative of the current flowing at least one phase winding of the motor.

15. The method of claim 9, comprising generating the first and second actual rotor position input signals by differentiating the current flowing through at least one phase of the motor.

* * * * *